United States Patent [19]

Rogers

[11] 3,793,538

[45] Feb. 19, 1974

[54] CIRCUIT FOR PERIODICALLY ENERGIZING AN ELECTRICAL LOAD

[75] Inventor: Wesley A. Rogers, Grosse Pte. Park, Mich.

[73] Assignee: General Motors Corporation, Detroit, Mich.

[22] Filed: Nov. 30, 1972

[21] Appl. No.: 310,716

[52] U.S. Cl. ............ 307/252 M, 307/255, 307/274, 307/293

[51] Int. Cl. ............ H03k 17/00

[58] Field of Search 307/293, 301, 274, 210, 252 M; 328/73

[56] References Cited

UNITED STATES PATENTS

| | | | |
|---|---|---|---|
| 3,694,670 | 9/1972 | Marzolf | 307/252 M |
| 3,085,165 | 4/1963 | Schaffert et al. | 307/301 X |
| 2,462,897 | 3/1949 | Rector | 315/340 UX |
| 2,874,333 | 2/1959 | Gray | 315/340 |
| 3,299,288 | 1/1967 | McDowell et al. | 307/252 M |

OTHER PUBLICATIONS

G. E. SCR Manual, 2nd Ed., 12/61, pages 72, 73 & 135–138

GE Application Note 90.6 Use of Complementary Transistors in Switching Circuit by Stasior, 5/62, page 6.

*Primary Examiner*—Rudolph V. Rolinec
*Assistant Examiner*—B. P. Davis
*Attorney, Agent, or Firm*—Richard G. Stahr

[57] ABSTRACT

A silicon controlled rectifier is connected in series with an electrical load to be periodically energized across a direct current potential source. The emitter-collector electrodes of a type PNP transistor are connected in shunt across the anode-cathode electrodes of the silicon controlled rectifier and the base electrode is connected to ground through the collector-emitter electrodes of a type NPN transistor. The output signals of a square wave output type oscillator circuit trigger the silicon controlled rectifier conductive to complete an energizing circuit for the electrical load and another oscillator circuit, responsive to the potential appearing across the electrical load, produces an output signal which triggers the type NPN transistor conductive through the collector-emitter electrodes to ground the base electrode of the type PNP transistor to trigger this device conductive through the emitter-collector electrodes, a condition which drains holding current from the silicon controlled rectifier.

5 Claims, 1 Drawing Figure

PATENTED FEB 19 1974
3,793,538
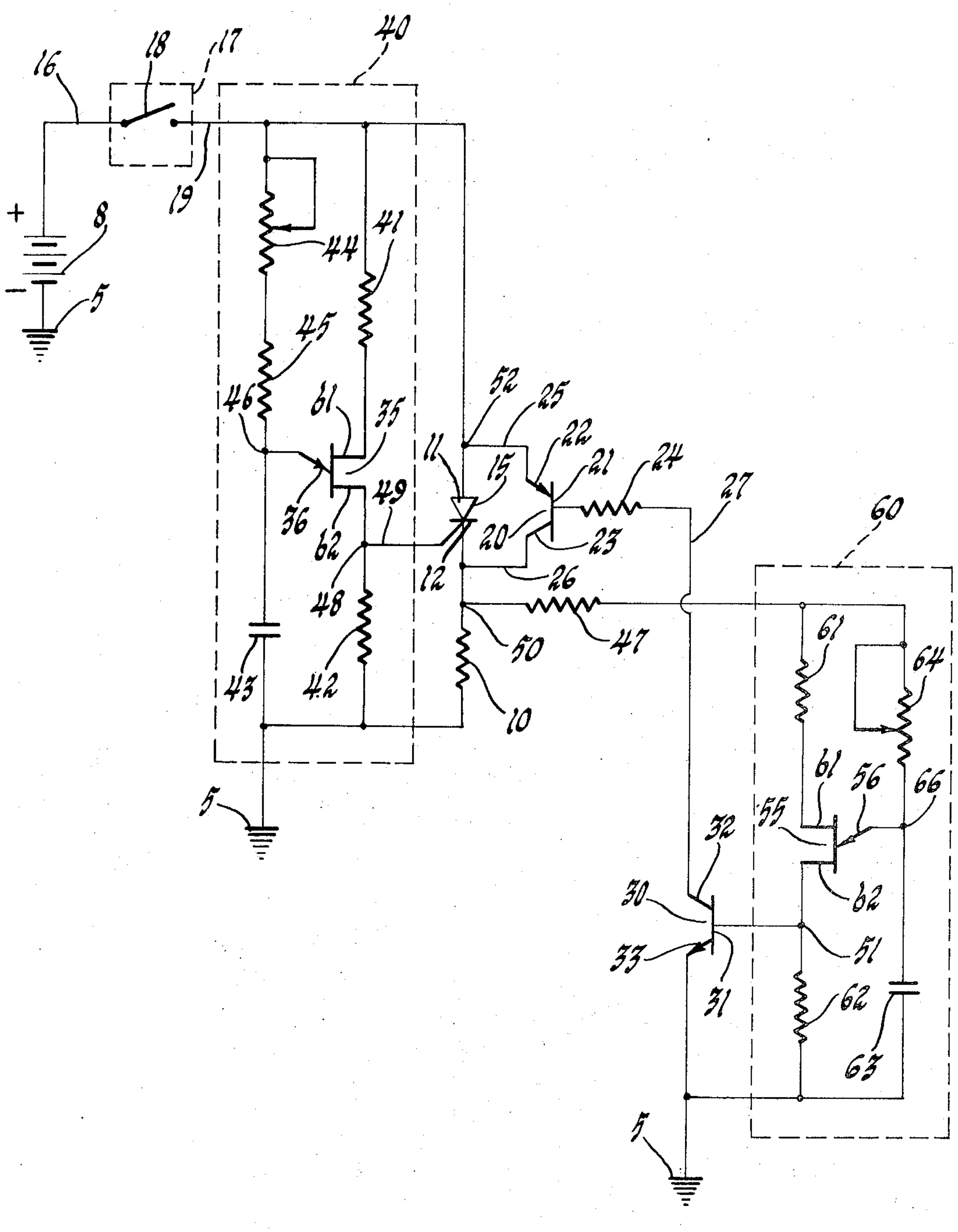

CIRCUIT FOR PERIODICALLY ENERGIZING AN ELECTRICAL LOAD

This invention is directed to a circuit for periodically energizing an electrical load and, more specifically, to a circuit of this type employing a silicon controlled rectifier as the electrical switch and a type PNP transistor having the emitter-collector electrodes connected in shunt across the anode-cathode electrodes of the silicon controlled rectifier to extinguish this device.

As is well known in the art, with a direct current potential impressed across the anode-cathode electrodes, a silicon controlled rectifier may be triggered conductive by a trigger signal applied across the gate-cathode electrodes and the device will remain conductive after the removal of the gate signal. To commutate or "turn off" silicon controlled rectifiers employed as switches in direct current potential circuits, it is necessary that the direct current potential power be momentarily interrupted, or a reverse current equal to the holding current be applied across the cathode-anode electrodes or the silicon controlled rectifier be momentarily short-circuited. Prior art schemes for commutating silicon controlled rectifiers employed as switches in direct current potential circuits relied upon a separate floating power supply of a capacity large enough to supply the required reverse current, or an inductor-capacitor tuned circuit to supply the reverse current, or transformer-diode commutating circuits to supply the required reverse current.

It is, therefore, an object of this invention to provide an improved silicon controlled rectifier commutating circuit.

It is a further object of this invention to provide an improved circuit for periodically energizing an electrical load in which a silicon controlled rectifier employed as a direct current switch is commutated off by switching a type PNP transistor, having the emitter-collector electrodes connected in shunt across the anode-cathode electrodes of the silicon controlled rectifier, conductive to provide a momentary short-circuit around the silicon controlled rectifier.

In accordance with this invention, a circuit for periodically energizing an electrical load is provided wherein a silicon controlled rectifier, connected in series with an electrical load across the positive and negative polarity output terminals of a source of direct current potential, is triggered conductive through the anode-cathode electrodes to energize the electrical load by the output signals of a square wave output signal type oscillator and is commutated off by providing a momentary short-circuit across the anode-cathode electrodes thereof through the emitter-collector electrodes of a type PNP transistor which is triggered conductive by an electrical signal produced in response to the flow of current through the electrical load.

For a better understanding of the present invention, together with additional objects, advantages and features thereof, reference is made to the following description and accompanying single FIGURE drawing.

As point of reference or ground potential is the same point electrically throughout the system, it has been represented in the FIGURE by the accepted schematic symbol and referenced by the numeral 5.

In the drawing, the circuit of this invention for periodically energizing an electrical load is set forth in combination with a source of direct current potential having positive and negative polarity output terminals, which may be a battery 8, and an electrical load 10 to be periodically energized. In the FIGURE, the electrical load to be energized is represented as a resistor, however, it is to be specifically understood that the electrical load need not necessarily be resistive as any electrical load may be periodically energized by the circuit of this invention.

The anode electrode 11 and the cathode electrode 12 of silicon controlled rectifier 15 and the electrical load 10 are connected in series across the source of direct current potential, battery 8, through a circuit which may be traced from the positive polarity terminal of battery 8, through lead 16, a conventional single pole-single throw electrical switch 17, lead 19, the anode-cathode electrodes of silicon controlled rectifier 15, load 10 and point of reference or ground potential 5 to the negative polarity terminal of battery 8.

The emitter electrode 22 and collector electrode 23 of type PNP transistor 20 are connected across the anode-cathode electrodes of silicon controlled rectifier 15 through respective lead 25 and 26 and the base electrode 21 is connected to the negative polarity output terminal of battery 8 through a current limiting resistor 24, lead 27, the current carrying elements of an electrical switching device of the type having current carrying elements operable to an electrical circuit closed condition in response to an electrical signal, which may be a type NPN switching transistor 30 having the usual base 31, collector 32 and emitter 33 electrodes, and point of reference or ground potential 5.

To operate the circuit of this invention, circuitry is provided for producing a series of electrical trigger signals which are applied across the gate-cathode electrodes of silicon controlled rectifier 15 whereby this device is triggered conductive by each trigger signal and other circuitry is provided for producing an electrical signal after each one of the trigger signals which is applied to the electrical switching device to operate the current carrying elements of this device to the electrical circuit closed condition. When operated to the electrical circuit closed condition, the electrical switching device establishes a circuit for the flow of emitter-base current through type PNP transistor 20 to trigger this device conductive through the emitter-collector electrodes, a condition which extinguishes silicon controlled rectifier 15 by reducing the load current therethrough to a value less than the required holding current.

In the FIGURE, the circuitry for producing the series of electrical trigger signals is illustrated as a conventional unijunction transistor type relaxation oscillator circuit 40 and the circuitry for producing an electrical signal after each one of the trigger signals is illustrated as a conventional unijunction transistor type relaxation oscillator circuit 60. The base b1 and b2 electrodes of unijunction transistor 35 of oscillator circuit 40 are connected across battery 8 through respective base resistors 41 and 42, timing capacitor 43 is connected across battery 8 through variable resistor 44 and fixed resistor 45 and the emitter electrode 36 of unijunction transistor 35 is connected to junction 46 between fixed resistor 45 and timing capacitor 43. The base b1 and b2 electrodes of unijunction transistor 55 of oscillator circuit 60 are connected across the electrical load 10 through current limiting resistor 47 and respective base resistors 61 and 62, timing capacitor 63 is connected across electrical load 10 through current limiting resistor 47 and variable resistor 64 and the emitter electrode 56 of unijunction transistor 55 is connected to junction 66 between variable resistor 64 and timing capacitor 63.

Upon the closure of movable contact 18 of switch 17 to the electrical circuit closed condition, timing capacitor 43 begins charging through variable resistor 44 and fixed resistor 45. When the charge upon timing capacitor 43 has reached the peak point potential of unijunction transistor 35, this device breaks down and conducts through the base electrodes. With unijunction transistor 35 conducting through the base electrodes, a trigger signal appears across junction 48 and point of reference or ground potential 5 of a positive polarity upon junction 48 with respect to point of reference or ground potential 5. After capacitor 43 has discharged through the emitter electrode 36 and base electrode b2 of unijunction transistor 35, this device becomes not conductive and capacitor 43 again begins to charge. Consequently, unijunction transistor oscillator circuit 40 produces a series of electrical trigger signals of a frequency determined by the setting of variable resistor 44.

The trigger signals appearing across junction 48 and point of reference or ground potential 5 are applied across the gate-cathode electrodes of silicon controlled rectifier 15 through lead 49 and through point of reference or ground potential 5 and electrical load 10, respectively. As these trigger signals are applied across the gate-cathode electrodes of silicon controlled rectifier 15 in the proper polarity relationship to produce gate current, silicon controlled rectifier 15 is triggered conductive through the anode-cathode electrodes by each of the trigger signals.

Upon being triggered conductive by each of the trigger signals produced by unijunction transistor oscillator circuit 40, the energization circuit for electrical load 10, previously described, is established. Upon the flow of current through electrical load 10, an electrical signal appears across junction 50 and point of reference or ground potential 5 of a positive polarity upon junction 50 with respect to point of reference or ground potential 5. The electrical signal appearing across electrical load 10 is of a magnitude equal to the magnitude of the potential of battery 8 less the drop through silicon controlled rectifier 15 and is applied through current limiting resistor 47 to the input circuit of oscillator circuit 60. Consequently, this electrical signal charges timing capacitor 63 of oscillator circuit 60 through current limiting resistor 47 and variable resistor 64. When the charge upon timing capacitor 63 has reached the peak point potential of unijunction transistor 55, this device breaks down and conducts through the base electrodes. With unijunction transistor 55 conducting through the base electrodes, an output signal appears across junction 51 and point of reference or ground potential 5 of a positive polarity upon junction 51 with respect to point of reference or ground potential 5.

This output signal of oscillator circuit 60 is applied across the base-emitter electrodes of type NPN switching transistor switch 30 in the proper polarity relationship to produce emitter-base current through a type NPN transistor, consequently, this signal triggers transistor 30 conductive through the collector-emitter electrodes. Upon the conduction of switching transistor 30 through the collector-emitter electrodes, a circuit is established for the flow of emitter-base current through type PNP transistor 21 which may be traced from junction 52, through the emitter-base electrodes of transistor 20, current limiting resistor 24, the collector-emitter electrodes of transistor 30 and point of reference or ground potential 5 to the negative polarity terminal of battery 8. The flow of emitter-base current through type PNP transistor 20 triggers this device conductive through the emitter-collector electrodes thereof to provide a short-circuit around the anode-cathode electrodes of silicon controlled rectifier 15. As this short-circuit reduces the load current through silicon controlled rectifier 15 to a value less than the required holding current, silicon controlled rectifier 15 extinguishes to interrupt the energizing circuit for electrical load 10.

After timing capacitor 63 has discharged through the emitter electrode 56 and base electrode b2 of unijunction transistor 55, unijunction transistor 55 again becomes not conductive. As there is no current flowing through electrical load 10 with silicon controlled rectifier 15 extinguished, timing capacitor 63 does not begin to charge until silicon controlled rectifier 15 has been triggered conductive by the next trigger signal produced by unijunction transistor oscillator 40.

From this description, it is apparent that the circuit for periodically energizing an electrical load of this invention periodically energizes electrical load 10 at a frequency determined by the frequency of the series of electrical trigger signals produced by unijunction transistor oscillator circuit 40 and for a period of time as determined by the R-C time constant of variable resistor 64 and capacitor 63.

Although the circuit for producing the series of electrical trigger signals has been illustrated in the FIGURE as a conventional unijunction transistor relaxation oscillator circuit 40, it is to be specifically understood that any other oscillator of the type which produces a series of square wave output signals may be substituted therefor without departing from the spirit of the invention. For example, a free-running multivibrator circuit or the combination of a conventional bistable multivibrator circuit operated by any other type oscillator circuit may be substituted for unijunction transistor relaxation oscillator circuit 40. Similarly, although the circuit for producing an electrical signal after each one of the trigger signals has been illustrated in the FIGURE as a unijunction transistor relaxation oscillator circuit 60, it is to be specifically understood that any other oscillator circuit of the type which produces an output signal in response to an electrical signal applied to the input circuit thereof may be substituted therefor without departing from the spirit of the invention. For example, a conventional monostable multivibrator circuit may be substituted for the unijunction transistor relaxation oscillator circuit 60.

The circuit of this invention may also be employed as the commutating circuit for each of the silicon controlled rectifiers of a solid state inverter circuit, well known in the art, through which an alternating current load such as an alternating current motor may be energized from a direct current potential source. As is well known in the inverter circuit art, electrical trigger signals are produced by associated logic circuitry for triggering the proper inverter silicon controlled rectifiers conductive and other trigger signals are produced by associated logic circuitry for commutating the proper inverter silicon controlled rectifiers off to cyclically energize an alternating current load from a direct current potential source. The trigger signals produced by the associated logic circuitry for commutating the proper inverter silicon controlled rectifiers off may be applied to the base of the proper switching transistor of the circuit of this invention to trigger each conductive for the purpose of extinguishing the corresponding inverter silicon controlled rectifier, as explained hereinabove in this specification.

While a preferred embodiment of the present invention has been shown and described, it will be obvious to those skilled in the art that various modifications and substitutions may be made without departing from the spirit of the invention which is to be limited only within the scope of the appended claims.

What is claimed is:

1. A circuit for periodically energizing an electrical load comprising in combination with a source of direct current potential having positive and negative polarity output terminals and an electrical load to be periodically energized, a silicon controlled rectifier having anode-cathode and gate electrodes, means for connecting said anode-cathode electrodes of said silicon controlled rectifier and said electrical load in series across said output terminals of said source of direct current potential, a type PNP transistor having emitter, collector and base electrodes, means for connecting said emitter-collector electrodes of said type PNP transistor across said anode-cathode electrodes of said silicon controlled rectifier, means for producing a series of electrical trigger signals, means for applying said trigger signals across said gate-cathode electrodes of said silicon controlled rectifier whereby said silicon controlled rectifier is triggered conductive by each of said trigger signals, a normally open electrical switching device of the type having current carrying elements operable to an electrical circuit closed condition in response to an electrical signal, means for connecting said base electrode of said type PNP transistor to said negative polarity output terminal of said source of direct current potential through said current carrying elements of said electrical switching device, means for producing an electrical signal after each one of said trigger signals, and means for applying said electrical signals to said electrical switching device.

2. A circuit for periodically energizing an electrical load comprising in combination with a source of direct current potential having positive and negative polarity output terminals and an electrical load to be periodically energized, a silicon controlled rectifier having anode, cathode and gate electrodes, means for connecting said anode-cathode electrodes of said silicon controlled rectifier and said electrical load in series across said output terminals of said source of direct current potential, a type PNP transistor having emitter, collector and base electrodes, means for connecting said emitter-collector electrodes of said type PNP transistor across said anode-cathode electrodes of said silicon controlled rectifier, means for producing a series of electrical trigger signals, means for applying said trigger signals across said gate-cathode electrodes of said silicon controlled rectifier whereby said silicon controlled rectifier is triggered conductive by each of said trigger signals, a type NPN transistor having collector, emitter and base electrodes, means for connecting said base electrode of said type PNP transistor to said negative polarity output terminal of said source of direct current potential through said collector-emitter electrodes of said type NPN transistor, means for producing an electrical signal after each one of said trigger signals, and means for applying said electrical signals across said base-emitter electrodes of said type NPN transistor.

3. A circuit for periodically energizing an electrical load comprising in combination with a source of direct current potential having positive and negative polarity output terminals and an electrical load to be periodically energized, a silicon controlled rectifier having anode, cathode and gate electrodes, means for connecting said anode-cathode electrodes of said silicon controlled rectifier and said electrical load in series across said output terminals of said source of direct current potential, a type PNP transistor having emitter, collector and base electrodes, means for connecting said emitter-collector electrodes of said type PNP transistor across said anode-cathode electrodes of said silicon controlled rectifier, a first oscillator circuit for producing a series of electrical trigger signals, means for applying said trigger signals across said gate-cathode electrodes of said silicon controlled rectifier whereby said silicon controlled rectifier is triggered conductive by each of said trigger signals, a type NPN transistor having collector, emitter and base electrodes, means for connecting said base electrode of said type PNP transistor to said negative polarity output terminal of said source of direct current potential through said collector-emitter electrodes of said type NPN transistor, means for producing an electrical signal in response to the flow of current through said electrical load upon the conduction of said silicon controlled rectifier, and means for applying said electrical signal across said base-emitter electrodes of said type NPN transistor.

4. A circuit for periodically energizing an electrical load comprising in combination with a source of direct current potential having positive and negative polarity output terminals and an electrical load to be periodically energized, a silicon controlled rectifier having anode, cathode and gate electrodes, means for connecting said anode-cathode electrodes of said silicon controlled rectifier and said electrical load in series across said output terminals of said source of direct current potential, a type PNP transistor having emitter, collector and base electrodes, means for connecting said emitter-collector electrodes of said type PNP transistor across said anode-cathode electrodes of said silicon controlled rectifier, a first oscillator circuit for producing a series of electrical trigger signals, means for applying said trigger signals across said gate-cathode electrodes of said silicon controlled rectifier, whereby said silicon controlled rectifier is triggered conductive by each of said trigger signals, a type NPN transistor having collector, emitter and base electrodes, means for connecting said base electrode of said type PNP transistor to said negative polarity output terminal of said source of direct current potential through said collector-emitter electrodes of said type NPN transistor, a second oscillator circuit of the type which produces an output signal in response to an electrical signal applied to the input circuit thereof, means for applying the electrical signal appearing across said electrical load upon the conduction of said silicon controlled rectifier to the said input circuit of said second oscillator, and means for applying said output signal of said second oscillator across said base-emitter electrodes of said type NPN transistor.

5. A circuit for periodically energizing an electrical load comprising in combination with a source of direct current potential having positive and negative polarity output terminals and an electrical load to be periodically energized, a silicon controlled rectifier having anode, cathode and gate electrodes, means for connecting said anode-cathode electrodes of said silicon controlled rectifier and said electrical load in series across said output terminals of said source of direct current potential, a type PNP transistor having emitter, collector and base electrodes, means for connecting said emitter-collector electrodes of said type PNP transistor across said anode-cathode electrodes of said silicon controlled rectifier, a variable frequency oscillator circuit for producing a series of electrical trigger signals, means for applying said trigger signals across said gate-cathode electrodes of said silicon controlled rectifier whereby said silicon controlled rectifier is triggered conductive by each of said trigger signals, a type NPN transistor having collector, emitter and base electrodes, means for connecting said base electrode of said type PNP transistor to said negative polarity output terminal of said source of direct current potential through said collector-emitter electrodes of said type NPN transistor, a second oscillator circuit of the type which produces an output signal in response to an electrical signal applied to the input circuit thereof, means for applying the electrical signal appearing across said electrical load upon the conduction of said silicon controlled rectifier to the said input circuit of said second oscillator, and means for applying said output signal of said second oscillator across said base-emitter electrodes of said type NPN transistor.

* * * * *